(12) United States Patent
Adams et al.

(10) Patent No.: US 7,141,310 B2
(45) Date of Patent: *Nov. 28, 2006

(54) METAL MATRIX COMPOSITE STRUCTURE AND METHOD

(75) Inventors: Richard W. Adams, Marlboro, MA (US); Grant C. Bennett, Belmont, MA (US); Kevin Fennessy, New Bedford, MA (US); Robert A. Hay, Dudley, MA (US); Mark Occhionero, Milford, MA (US)

(73) Assignee: Ceramics Process Systems Corporation, Chartley, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/145,301

(22) Filed: Jun. 3, 2005

(65) Prior Publication Data

US 2006/0000591 A1    Jan. 5, 2006

Related U.S. Application Data

(63) Continuation-in-part of application No. 11/109,834, filed on Apr. 19, 2005, now abandoned, which is a continuation of application No. 10/124,571, filed on Apr. 17, 2002, now Pat. No. 6,884,522.

(51) Int. Cl.
*H01L 23/36* (2006.01)
*B32B 5/22* (2006.01)
*B32B 5/32* (2006.01)
*B32B 7/02* (2006.01)
*B32B 15/20* (2006.01)

(52) U.S. Cl. ...... 428/614; 428/550; 428/551; 428/620; 428/621; 428/212; 428/539.5

(58) Field of Classification Search ...... None
See application file for complete search history.

(56) References Cited

U.S. PATENT DOCUMENTS

| | | | | |
|---|---|---|---|---|
| 3,547,180 A | * | 12/1970 | Ray et al. | 164/61 |
| 4,816,347 A | * | 3/1989 | Rosenthal et al. | 428/615 |
| 4,942,076 A | * | 7/1990 | Panicker et al. | 428/137 |
| 4,990,490 A | * | 2/1991 | Pathare et al. | 505/431 |
| 5,020,583 A | * | 6/1991 | Aghajanian et al. | 164/97 |
| 5,039,577 A | * | 8/1991 | Knoell et al. | 428/650 |
| 5,080,934 A | * | 1/1992 | Naik et al. | 427/271 |
| 5,163,499 A | * | 11/1992 | Newkirk et al. | 164/98 |
| 5,287,248 A | * | 2/1994 | Montesano | 361/708 |
| 5,294,447 A | * | 3/1994 | Mackles et al. | 424/489 |

(Continued)

OTHER PUBLICATIONS

* Blucher, J., "Discussion Of A Liquid Metal Pressure Infiltration Process To Produce Metal Matrix Composites," *J. of Mat. Proc. Techn.* 30: 381-390, 1992.

(Continued)

Primary Examiner—Jennifer C. McNeil
Assistant Examiner—Jason Savage
(74) Attorney, Agent, or Firm—Sam Pasternack; Choate Hall and Stewart LLP

(57) ABSTRACT

Compound preforms are provided having a first region, including a porous ceramic and a second region including a porous or solid ceramic in which the two regions differ in composition. The compound preform is infiltrated with a liquid metal which is then solidified to form a metal matrix composite.

14 Claims, 3 Drawing Sheets

U.S. PATENT DOCUMENTS

| | | | | |
|---|---|---|---|---|
| 5,294,477 | A | | 3/1994 | Kanba et al. ................ 428/212 |
| 5,296,310 | A | * | 3/1994 | Kibler et al. ................ 428/614 |
| 5,371,043 | A | * | 12/1994 | Anderson et al. ............ 29/832 |
| 5,421,087 | A | * | 6/1995 | Newkirk et al. ........... 29/897.2 |
| 5,458,480 | A | * | 10/1995 | Newkirk et al. ............ 425/547 |
| 5,526,867 | A | * | 6/1996 | Keck et al. .................... 164/97 |
| 5,532,513 | A | * | 7/1996 | Smith et al. ................ 257/703 |
| 5,544,412 | A | * | 8/1996 | Romero et al. ............... 29/832 |
| 5,549,151 | A | * | 8/1996 | Yang ........................... 164/97 |
| 5,618,635 | A | * | 4/1997 | Newkirk et al. ............ 428/614 |
| 5,639,531 | A | * | 6/1997 | Chen et al. .................... 428/49 |
| 5,657,811 | A | * | 8/1997 | Cook ........................... 164/97 |
| 5,664,616 | A | * | 9/1997 | Gegel ........................... 164/97 |
| 5,746,387 | A | * | 5/1998 | Pretto et al. ............... 242/571.2 |
| 5,819,858 | A | * | 10/1998 | Nechansky ................. 174/252 |
| 5,838,063 | A | * | 11/1998 | Sylvester .................... 257/704 |
| 5,868,887 | A | * | 2/1999 | Sylvester et al. ........... 156/150 |
| 5,944,097 | A | * | 8/1999 | Gungor et al. .............. 165/185 |
| 5,958,572 | A | * | 9/1999 | Schmidt et al. .......... 428/320.2 |
| 5,983,974 | A | * | 11/1999 | Sylvester .................... 164/97 |
| 6,003,221 | A | * | 12/1999 | Sawtell et al. ............. 29/527.6 |
| 6,037,066 | A | * | 3/2000 | Kuwabara ................... 428/610 |
| 6,460,598 | B1 | * | 10/2002 | Adams et al. ................ 164/98 |
| 6,595,264 | B1 | * | 7/2003 | Lutz-Nivet et al. ........... 164/98 |
| 6,884,522 | B1 | | 4/2005 | Adams et al. .............. 428/614 |

OTHER PUBLICATIONS

* Masur, et al., "Infiltration Of Fibrous Preforms By A Pure Metal: Part II. Experiment," *Metallurgical Trans.* 20A: 2549-2557, 1989.
* Mortensen, et al., "Pressure-Infiltration Processing Of Reinforced Aluminum," *JOM*, 36-63, 1993.
* Mortensen, et al., "Solidfication Processing Of Metal-Matrix Composites," *J. of Metals*, 12-19, 1988.
* Nourbakhshm, et al., "An Apparatus For Pressue Casting Of Fibre-Reinforced High-Temperature Metal-Matrix Composites," *J. Phys. E. Sci. Instrument* 21: 898-902, 1989.
* Premkumar, et al., "Aluminum Composite Materials For Multichip Modules," *JOM*, 24-28, 1992.
* Romero, et al., "Development Of Metal Matrix Composite Baseplate Technology For High Current Power Moedules," *ISHM Proceedings*, 421-426, 1994.
* Roudier, P., "Mechanical Properties Of Cast Pure And Alloyed Aluminum Reinforced With A High Volume Fraction Of Carbide Particles," 2-3, 1989.

* cited by examiner

METAL MATRIX COMPOSITE STRUCTURE AND METHOD

This application claims priority as a continuation in part of U.S. Ser. No. 11/109,834, filed Apr. 19, 2005, now abandoned which is a continuation of U.S. Ser. No. 10/124,571, filed Apr. 17, 2002, now issued as U.S. Pat. No. 6,884,522, the entire contents of which are incorporated herein by reference.

BACKGROUND OF THE INVENTION

This invention relates to metal matrix composites and methods of manufacturing, and more particularly, to a metal matrix composite having at least two regions that differ in composition.

Metal matrix composites are well-known materials that typically include a discontinuous particulate reinforcement phase within a continuous metal phase. An example is aluminum silicon carbide, AlSiC, which is made by infiltrating a porous, silicon carbide preform with molten aluminum.

The AlSiC metal matrix composite system has the positive attributes of high thermal conductivity, low coefficient of thermal expansion, and is lightweight. These attributes render AlSiC metal matrix composites suitable as a housing or substrate for containing or supporting electronic devices such as integrated circuit chips for which thermal conduction, coefficient of thermal expansion (CTE), and mechanical design features are important.

Some applications employing metal matrix composites require different coefficients of thermal expansion at different regions within or on a single, integral component. For example, some electronic devices need to be mounted on substrates with high CTE and others to substrates with low CTE. As another example, there might be a sandwich construction having a low CTE device such as an IC on one side, a high CTE substrate, such as organic board on the other side with an intermediate interlayer between them. Yet another structure is a lid covering both an IC and a substrate and is in interfacial contact with both. Previously, these needs would require separate substrates, or performance tradeoffs for a single composition component structure.

The prior art comprehended structures with a single metal matrix composite composition within a given structure that might incorporate secondary components such as substrates, seal lips, and feed-throughs. The prior art does not, however, disclose a single, integral composite component having regions with different properties.

SUMMARY OF THE INVENTION

In one aspect, the invention is a powered device including a heat generating component, a heat sink, and a metal matrix composite in thermal communication with both the heat generating component and the heat sink. The metal matrix composite includes a first region and a second region. Each of the regions includes a porous ceramic infiltrated with a metal matrix. The porous ceramics of the first region and second region differ in material composition and the regions and the composite have different thermal conductivities. The porous ceramic may include silicon carbide, aluminum nitride or a porous metal matrix composite. The metal may be aluminum or copper.

In another aspect, the invention is a powered device including a heat generating component, a heat sink, and a metal matrix composite in thermal communication with both the heat generating component and the heat sink. The metal matrix composite includes a first layer and a second layer, each of which includes a porous ceramic having a volume percent of particulates in the range of 10%–75% infiltrated with a metal matrix. The porous ceramic of the first layer and the porous ceramic of the second layer differ in volume percent of particulates, and the layers in the composite have different thermal conductivities.

In another aspect, the invention is a powered device including a heat generating component, a heat sink, and a metal matrix composite in thermal communication with both the heat generating component and the heat sink. The metal matrix composite includes a first region and a second region. The first region includes a porous ceramic infiltrated with a metal matrix, and the second region includes a material having a thermal conductivity of about 400 W/mK or greater. The materials of the first region and the materials of the second region differ in material composition, and the regions in the composite have different thermal conductivities. The material having a thermal conductivity of 400 W/mK or greater may be copper, pyrolytic graphide, carbon fiber, diamond, or cubic boron nitride. The second region may be fabricated as a plurality of spaced strips in a plain transverse to a direction from which heat from the heat generating device enters the metal matrix composite. A thermally conducted material may be disposed between the heat generating device and the metal matrix composite. The heat generating device may be an LED, a radar antenna, or a radar transmitter. The second region may include a plurality of materials, and the second region may have a thermal conductivity of about 400 W/mK or greater. The second region may include a first material and a second material, and the first material may have at least one void in which the second material is disposed. The void may extent partway or all the way across a thickness of the first material. The second material may protrude beyond a surface of the first material. A wall of the void may meet a surface of the first region from which the void protrudes at an angle other than perpendicular.

The present invention allows a single, integral composite component to be made which has different properties in different areas. For example, an area that needs post-production machining can be made of a composite having a hardness that allows it to be more readily machined. Additionally, a component can be made having surfaces with different coefficients of thermal expansion so that secure attachments may be made to substrates having different thermal expansion characteristics. Further, components can be made incorporating regions of enhanced thermal conductivity in a high conductivity body.

DESCRIPTION OF THE PREFERRED EMBODIMENT

The assignee of this application fabricates metal matrix composites by first forming a particulate preform structure by an injection molding process. That is, a slurry of ceramic particles such as silicon carbide particles along with solvents and binders is injected into a mold maintained at a low temperature. The preform is removed from the mold then freeze-dried. A typical preform may have approximately 63 volume % particulates with the remainder open space. This SiC preform is then loaded into an infiltration tooling cavity and infiltrated with a liquid metal such as aluminum to completely impregnate the void space within the preform. The liquid metal is solidified and the result is the desired metal matrix composite in which SiC is the discontinuous particulate reinforcement and the aluminum metal forms a continuous matrix.

According to the present invention, more than one composition of preform is loaded into the infiltration tooling cavity followed by infiltration and solidification of metal phase into a single structure with a continuous metal phase throughout. The second preform composition may also be, for example, SiC, but at a different volume percent of particulates, for example, 10–15% on the low side up to approximately 75% SiC. The resulting metal matrix composite will have two or more different SiC compositions within the single entity in different regions.

Alternatively, the second preform can comprise a ceramic material different from that which constitutes the first preform. A different ceramic material may be, for example, AlN. The second preform could also be made of powdered metals such as Mo, Ti, W, or various steels. Yet another possibility is that the second preform be a metal matrix composite itself and placed into the infiltration tooling along with a first porous preform. The preforms are then cast with a metal matrix producing discontinuously reinforced composites in which more than one discontinuous phase composition may exist along with more than one metal matrix composition. As an example, the second metal matrix might be copper, wherein the first metal matrix might be aluminum.

Figure 1:
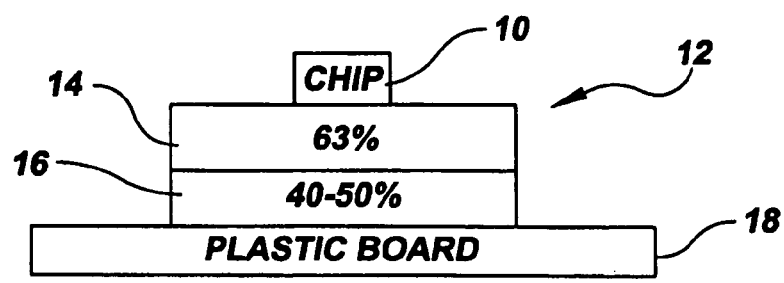
FIG. 1 is a schematic illustration of an embodiment of the invention having surfaces with different coefficients of thermal expansion.

An example structure according to the invention is shown in FIG. 1. A heat generating device, e.g., a microprocessor, chip, or LED 10 is supported on a unitary structure 12 that includes first and second regions 14 and 16, respectively. The unitary structure 12 itself rests on a plastic board substrate 18. The first region 14 is an aluminum silicon carbide metal matrix composite in which the silicon carbide makes up approximately 63% of the material. Such a material has a coefficient of thermal expansion of approximately 9 in a temperature range of 30–200° C. The second region 16 has silicon carbide solids in the range of 40–50% resulting in a coefficient of thermal expansion in the range of 10–12, also for the temperature range 30–200° C. The plastic board 18 has a typical coefficient of thermal expansion of 15, whereas the chip 10 has a CTE in the range of 4–6. Therefore, the CTE of the region 14 more nearly matches that of the chip 10 and the CTE of the second region 16 more nearly matches the CTE of the plastic board 18. As described above, the unitary structure 12 is made by forming two different preforms having the different volume % of particulates and placing them into the infiltration tooling for infiltration to create one body with a continuous metal matrix.

Figure 2:
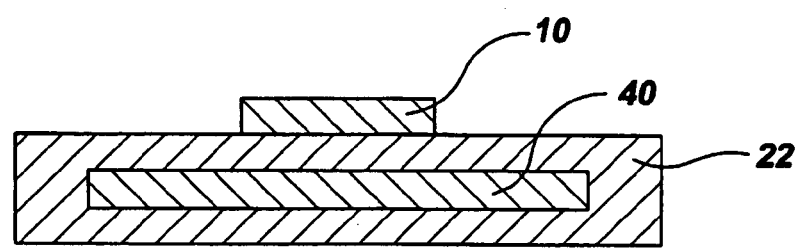
FIG. 2 is a cross-sectional view of an embodiment of the invention.
Figure 3:
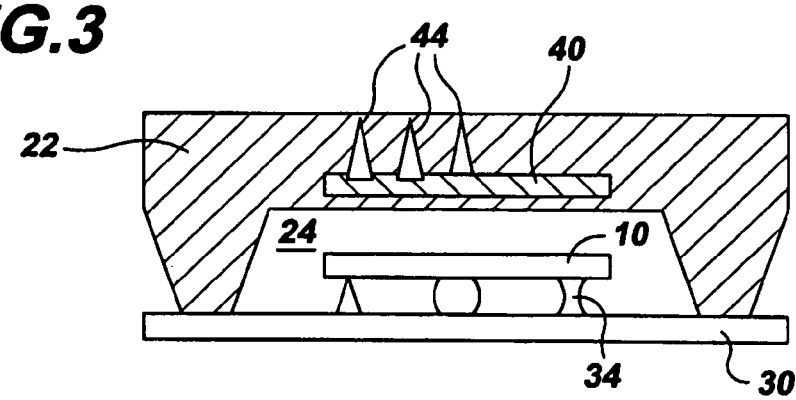
FIG. 3 is a cross-sectional view of another embodiment of the invention.

In an alternative embodiment, the metal matrix composite 22 includes a region 40 which has a different composition from the rest of the MMC 22 (FIG. 2). For example, the MMC 22 may be, for the most part, AlSiC whereas the region 40 might be a different composite or monolithic body. For example, the region 40 may itself be a metal matrix composite of, for example, copper (thermal conductivity=400 W/mK) and diamond. Alternatively, the region 40 might be a monolithic body such as pyrolytic graphite (PG), carbon fiber, or a multifilament tow. The materials forming the region 40 would form a preform within the preform forming the bulk of MMC 22. This composite preform would then be infiltrated with, for example, liquid aluminum. The region 40 can be tailored to provide a desired property such as enhanced thermal conductivity from the chip 10 through the lid 22 and into a heat sink thermally connected to MMC 22. Experimental studies have shown that an MMC 22 fabricated as a lid or heat sink for a chip 10 with pyrolytic graphite forming the region 40 can significantly reduce the operating temperature of the chip because of the enhanced thermal conductivity of pyrolytic graphite (FIG. 3). In FIG. 3, chip 10 is thermally connected to MMC 22 by a thermal interface or direct bond 24 and supported by underfill 34 on a PCB or ceramic substrate 30. A heat sink, not shown, is thermally connected to MMC 22.

Those skilled in the art will appreciate that the embodiment illustrated in FIG. 3 is quite general so that the infiltrating metal might be, for example, aluminum or copper. The reinforcement material in the region 40 may include inserts such as pyrolytic graphite, carbon fiber, or diamond (CVD or cemented), which is surrounded by AlSiC in the cast body. It is contemplated that the insert can fill the entire cross-sectional thickness of the MMC 22 or only partially fill it, i.e., 0.020 inch thick diamond insert in a 0.050 inch cross-section thickness lid. Carbon fiber and pyrolytic graphite materials are anisotropic in their thermal conduction, and therefore, insert geometry and orientation are selected as desired. Heat pipes or phase change materials (PCM) can also be used in the region 40. It is also contemplated to fabricate an integrated heat sink into the MMC 22. For example, diamond spikes 44, rods, or pins could protrude into pyrolytic graphite in the region 40 and extend through the MMC 22. In this embodiment, the diamond spikes 44 provide a high thermal conductivity path through the thickness of the pyrolytic graphite material, which itself has low thermal conductivity in the thickness direction.

The inserts in the region 40 of FIG. 3 can result in much higher thermal conductivity, possibly more than double that of copper. Thermal expansion coefficient can also be more closely matched to the lid and substrate. While the cost of this lid may be higher, this disadvantage is likely to be offset by a reduction in overall systems cost (e.g., obviating liquid cooling and refrigeration systems) and a marked increase in performance.

Figure 4:
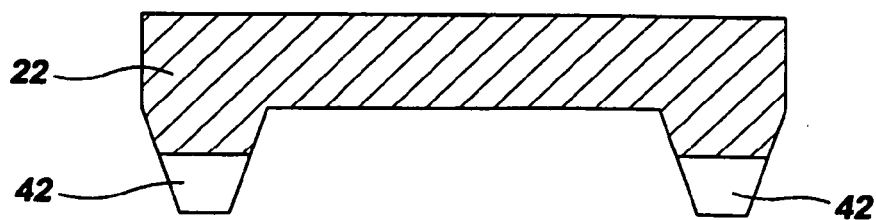
FIG. 4 is a cross-sectional view of yet another embodiment of the invention.

Yet another embodiment of the invention is shown in FIG. 4. In this embodiment, the MMC 22 is, for example, primarily AlSiC, but with a region 42 that is a different composite such as aluminum molybdenum. The structure in FIG. 4 is made by preparing appropriate preforms of SiC and Mo and infiltrating with aluminum. The Al—Mo regions 42 are more readily machinable than is the aluminum silicon carbide making up the remainder of the MMC 22.

The table below presents other exempary MMC structures for lids and other heat dispersing devices, as discussed below.

second high K material. The voids may extend part way or all the way through the insert. The walls of the voids may be perpendicular to the surface from which they project or situated at some other angle. The second high K material may project from one or more surfaces of the insert or may

TABLE

| Parameter | Option 1 | Option 2 | Option 3 | Option 4 | Option 5 | Option 6 | Option 7 | Option 8 |
|---|---|---|---|---|---|---|---|---|
| Matrix Metal | Al | Cu | | | | | | |
| Reinforcement Material | SiCp PG plate insert (PG: Kxy = 1700 W/mK, Kz = 10 W/mK) | SiCp + PG plate insert (PG: Kxy = 600–800, K = ? Z Axis) | SiCp + 2D C-Fiber insert (Fiber: K = 600–1200 W/mK Grade dependent) | SiCp + 3D C-Fiber Insert (Fiber: K = 600–1200 W/mK Grade dependent) | SiCp + C-Fiber Multifilament Tow (Fiber: K = 600–1200 W/mK Grade dependent) | SiCp + CVD Diamond plate insert K = 1000 W/mK or SiC Plate Coated w/CVD Diamond, Kxy = 500, Kz = 150–200 | Cubic Boron Nitride Particulates (CBN: K = 600 W/mK ? Isotropic) | SiCp + POCO Porous Graphite Foam insert (Foam: K = 1800 W/mK estimated bulk value: foam porosity = 70% |
| Reinforcement Geometry | Solid 2D Plate/Fabric | Plate/Fabric with Metal Thermal Pipes | Plate/Fabric/ Paper Orientation Options | Coil of Multifilament Tow | Plugs of Multifilament Tow | | | Material plug of lid shape foam insert |
| Heat Pipes/ PCM | Capture Miniature Spiral Tube - attach condenser to side | Capture Miniature Spiral Tube - fill with PCM | PCM filled cavity | | | | | |
| Coatings | Ni Plate | Ni + Au Flash | Flame Sprayed Ni | Flame Sprayed Babbitt | | | | |
| Lid Geometry | Thicker Lid | | | | | | | |

Note:
SiCp = SiC particulates
Kxy = Thermal Conductivity in X-Y Plane
Kz = Thermal Conductivity in Z Plane The values in the Table are merely representative and may vary as will be appreciated by those skilled in the art. In Option 1, for instance, Kxy could be in the range of 800–2000 W/mK. One skilled in the art will recognize that other materials having appropriate thermal conductivities may also be used as reinforcement materials.

Figure 5A:
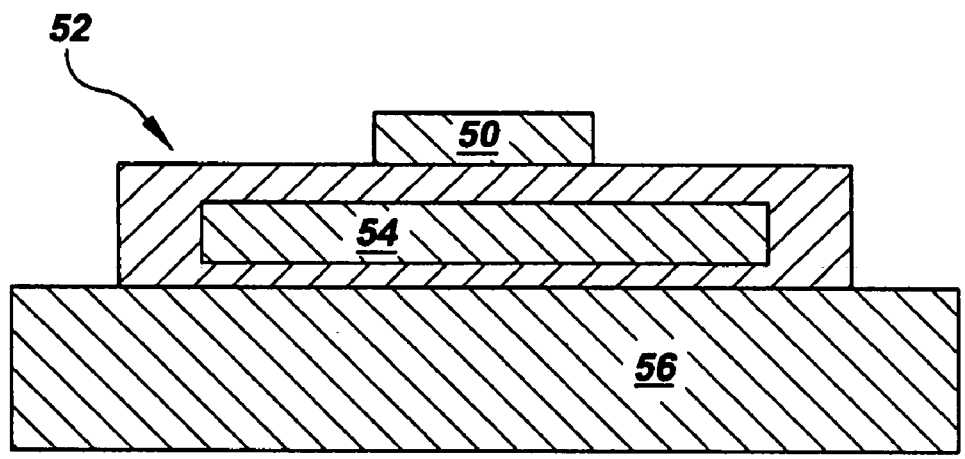
FIG. 5A is a cross-sectional schematic of a powered device according to an embodiment of the invention.
Figure 5B:
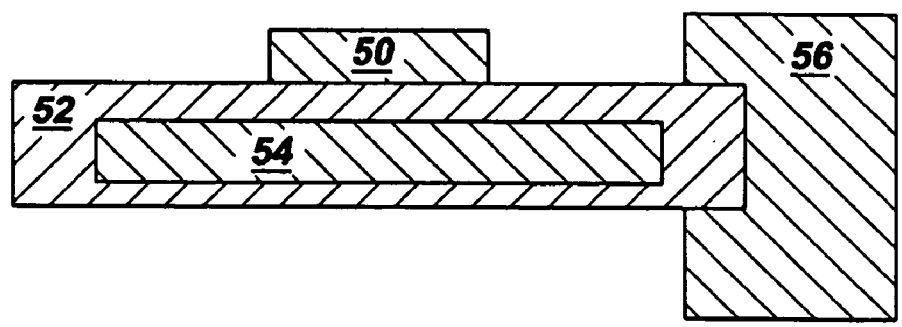
FIG. 5B is a cross-sectional schematic of a powered device according to an embodiment of the invention.

The metal matrix composites (MMCs) described above may be used to accelerate heat dissipation from a variety of devices. In general, the MMC, e.g., an AlSiC MMC such as those described above, is connected to a heat sink in such a way that heat may be conducted from the MMC to the heat sink. Exemplary arrangements of the MMC and the heat sink are shown in FIGS. 5A and 5B. In FIG. 5A, heat is dissipated from device 50 into MMC 52. High K insert 54 in the MMC 52 distributes the heat through the MMC transverse to an axis through the device and the MMC, reducing the heat flux density passing through the MMC. The heat is thus transmitted to heat sink 56 at a much lower flux density than when it originated from the device. FIG. 5B shows a similar arrangement, with the heat sink oriented transversely to the device.

Figure 6A:
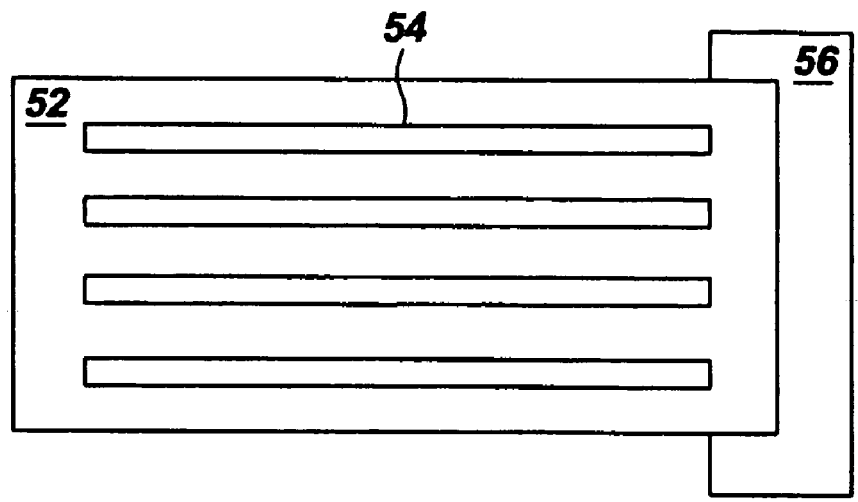
FIG. 6A is a cross-sectional schematic of an MMC and a heat sink according to an embodiment of the invention, in which the perspective of the schematic is looking down at the xy plane.
Figure 6B:
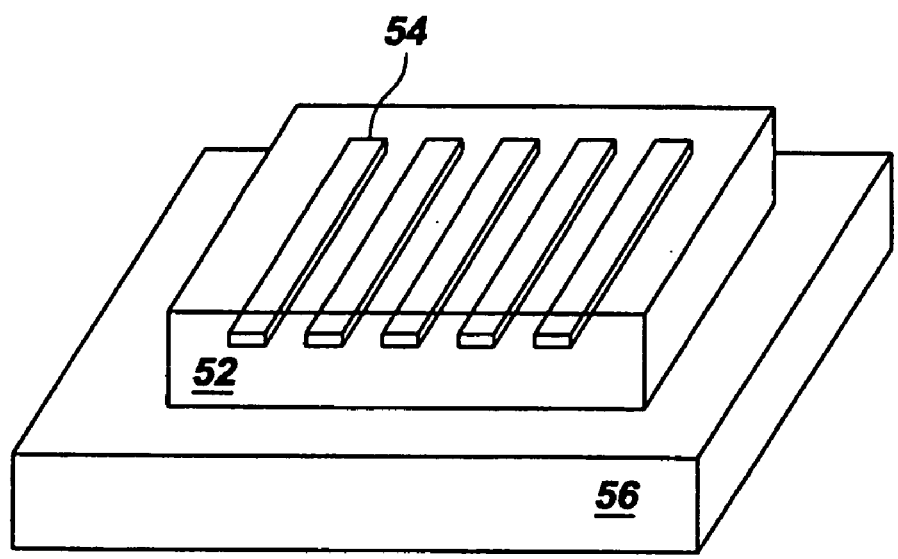
FIG. 6B is a perspective schematic of an MMC and a heat sink according to an alternative embodiment of the invention to that depicted in FIG. 6A.

The high K insert in the MMC need not be solid. Instead, it may be fabricated as an array of high K inserts, as shown in FIG. 6. In one embodiment, the high K inserts are fabricated as a series of slabs that disperse heat being transmitted in the z direction along the xy plane (FIG. 6A). In another embodiment, the high K inserts are disposed as a series of thin strips (FIG. 6B). Alternatively or in addition, the high K inserts may include voids, e.g., holes, channels, grooves, slots, etc. that may themselves be filled with a be flush with the surface(s) of the insert. The optimal geometry of the inserts depends on several factors, including the location of the heat sink with respect to the heat source, the degree and direction anisotropy of heat conduction of the high K material, and cost considerations. For example, use of multiple strips of high K material may reduce material costs. The strips dissipate heat through the xy plane, reducing the heat flux density and delivering heat to the heat sink at a rate at which it is better able to remove the heat from the MMC. Thus, the size of the MMC may also be adjusted to match the capacity and size of the heat sink. The MMC modifies the heat flux density from a device, reducing the heat flux into the heat sink to a more manageable level.

The device and the heat sink may be connected to the MMC using practically any method known to those skilled in the art. The connection should allow heat transmission from the device to the heat sink via the MMC. For example, the components may simply be clamped together. Thermal attachments may also employ a thermal grease to prevent any air gaps. To improve thermal conduction, manufacturers might directly attach the heat sink or the heat generating device to the MMC 22. For example, gallium arsenide or Si chips can be directly attached using a gold-tin solder. In this case, the MMC may be nickel-plated and gold flashed. Oftentimes a lead-tin solder is used, but any low temperature solder over the range 50–400° C. such as gold-tin is suitable. A lead-tin solder wets directly to a flame sprayed "Babbitt" coating. The "Babbitt" coating is 0.0005–0.0015 inch thick and is comprised of 88% Sn, 8% Sb, and 4% Cu. This coating has a solidus of 230° C. and liquidus of 354° C. and is sprayed over a flame-sprayed layer of Cu of 0.001–0.002 inch thickness. The attractive aspect of flame-sprayed coatings is low cost relative to plating. Flame-sprayed nickel may be compatible directly with a gold-tin solder attachment. Alternatively or in addition, the device and/or the heat sink may be soldered, brazed, or glued (e.g., with a thermal glue) to the MMC. Where the device and/or heat sink is attached to the MMC using these or other mechanically hard connections, the coefficients of thermal expansion of the solder, brazing material, glue, etc. may be matched to those of the components they are attaching together to minimize cracking. A "soft" bond may also be formed using a soft metal such as indium as an interface material. These materials form a direct bond between the surfaces.

The coefficient of thermal expansion of MMCs produced according to the invention allow them to be directly attached to devices such as LEDs without cracking. To further reduce the risk of cracking due to CTE mismatch, the CTE of the MMC may be adjusted using the techniques described herein so that the CTE of the MMC is just greater than that of the device. Then, as the device and substrate cool, the device will be put in slight compression. If the CTE of the MMC is equal to or less than that of the device, the device will be put in tension as it cools, increasing the risk of fracture.

There may also be an intermediate layer disposed between the device and the MMC. In some embodiments, the device is fabricated on the intermediate layer. For example, an LED may be fabricated on an AlN substrate. In other embodiments, an intermediate layer of a heat conducting material, such as AlN, silicon carbide, CVD diamond, etc., may be disposed between the device and the MMC. As for materials that are used to attach the MMC to the other components, the CTE of the intermediate layer may be selected to match those of the MMC and the device, and the mismatch may be adjusted to optimize the strain that develops as the various components cool.

The MMCs described herein may be used with a wide variety of heat generating devices. While practically any semiconductor-based device can benefit from the teachings of the invention, high power devices for which the power delivery is limited by the ability to dissipate the resulting heat will especially benefit. In addition, smaller devices with high power densities generate large amounts of heat over small areas. The heat can be dispersed over a larger area by the MMCs of the invention and then removed by conventional heat sink apparatus. Where a large number of small devices are arrayed over a small area, the MMCs can be used to conduct heat away from the devices quickly.

Exemplary devices that may be used with the MMCs include but are not limited to high brightness LEDs and microwave integrated circuits for phased array radars. In some embodiments, the LEDs may have a power rating of 100 W/cm$^2$ or more. High powered LEDs, including white light LEDs, may be used for, for example, general room illumination, automotive headlamps, signal lamps, task lights, low profile luminaries, low profile display lighting, backlighting for signs, and laser mounts and submounts. In all of these applications, it is desirable to provide brighter light, but brightness is limited by the ability to dissipate the resulting heat. In addition, the MMCs may be used for thermal management of dense LED and other emitter packages.

The MMCs may also be used for thermal management of electronic packages for use with microwave technology, for example, both passive and active phased microwave arrays. Phased array radars use high voltage amplifiers to generate high powered microwave signals. Radio frequency energy is lost as heat during amplification and transmission, and this heat can be initially dispersed by MMCs before being dissipated in a heat sink. The MMCs can be used in both S-band solid state antennas and X-band radar systems. In some embodiments, the MMCs are used to provide heat flux dissipation of 60–100 W/cm$^2$ for GaAs semiconductor and of 400–600 W/cm$^2$ or more for SiC semiconductor transmit/receive (T/R) modules.

It is recognized that modifications and variations of the present invention will occur to those skilled in the art, and it is intended that all such modifications and variations be included within the scope of the appended claims.

What is claimed is:

1. A powered device, comprising:
a heat generating component;
a heat sink; and
a metal matrix composite in thermal communication with both the heat generating component and the heat sink, the metal matrix composite comprising:
a first region and a second region, wherein each of the regions comprises a porous ceramic infiltrated with a metal matrix, the porous ceramic of the first region and the porous ceramic of the second region differing in material composition, wherein the regions in the composite have different thermal conductivities.

2. The powered device of claim 1, wherein the porous ceramic comprises silicon carbide, aluminum nitride, or a porous metal matrix composite.

3. The powered device of claim 1, wherein the metal is aluminum or copper.

4. The powered device of claim 1, wherein the second region comprises a first material and a second material, the first material having at least one void in which the second material is disposed.

5. The powered device of claim 4, wherein the void extends part way or all the way across a thickness of the first material.

6. The powered device of claim 4, wherein the second material protrudes beyond a surface of the first material.

7. The powered device of claim 4, wherein a wall of the void is not perpendicular to a surface of the first region from which the void protrudes.

8. A powered device, comprising:
a heat generating component;
a heat sink; and
a metal matrix composite in thermal communication with both the heat generating component and the heat sink, the metal matrix composite comprising:
a first layer and a second layer, wherein each of the layers comprises a porous ceramic having a volume percent of particulates in the range of 10%–75% infiltrated with a metal matrix, the porous ceramic of the first layer and the porous ceramic of the second layer differing in volume percent of particulates, wherein the layers in the composite have different thermal conductivities.

9. A powered device, comprising:
a heat generating component;
a heat sink; and
a metal matrix composite in thermal communication with both the heat generating component and the heat sink, the metal matrix composite comprising
a first region and a second region, wherein the first region comprises a porous ceramic infiltrated with a metal matrix, and the second region comprises a material having a thermal conductivity of about 400 W/mK or greater, wherein the materials of the first region and the material of the second region differ in material composition, and wherein the regions in the composite have different thermal conductivities.

10. The powered device of claim 9, wherein the material having a thermal conductivity of 400 W/mK or greater is selected from copper, pyrolytic graphite, carbon fiber, diamond, and cubic boron nitride.

11. The powered device of claim 9, wherein the second region is fabricated as a plurality of spaced strips in a plane transverse to a direction from which heat from the heat generating device enters the metal matrix composite.

12. The powered device of claim 9, wherein a thermally conductive material is disposed between the heat generating device and the metal matrix composite.

13. The powered device of claim 9, wherein the heat generating device is an LED, a radar antenna, or a radar transmitter.

14. The powered device of claim 9, wherein the second region comprises a plurality of materials, and wherein the second region has a thermal conductivity of about 400 W/mK or greater.

* * * * *